United States Patent
Nakadai

[19]

[11] Patent Number: 5,923,674

[45] Date of Patent: Jul. 13, 1999

[54] SEMICONDUCTOR ELECTRICALLY ERASABLE AND WRITEABLE NON-VOLATILE MEMORY DEVICE

[75] Inventor: Naotoshi Nakadai, Yamagata, Japan

[73] Assignee: NEC Corporation, Tokyo, Japan

[21] Appl. No.: 08/803,136

[22] Filed: Feb. 18, 1997

[30] Foreign Application Priority Data

Feb. 21, 1996 [JP] Japan .................................. 8-033879

[51] Int. Cl.[6] .................................................. G11C 29/00
[52] U.S. Cl. ...................................... 371/21.4; 371/21.2
[58] Field of Search ................................. 371/21.4, 21.2, 371/21.1; 365/201; 364/265

[56] References Cited

U.S. PATENT DOCUMENTS 5,287,317  2/1994  Kobayashi et al. ..................... 365/218
5,428,574  6/1995  Kuo et al. ............................... 365/201
5,475,646  12/1995  Ogihara .................................. 365/222
5,687,178  11/1997  Herr et al. ............................. 371/21.4

*Primary Examiner*—Hoa T. Nguyen
*Attorney, Agent, or Firm*—Foley & Lardner

[57] ABSTRACT

In a semiconductor electrically erasable and writable non-volatile memory device, a memory cell array 14 includes a test memory region 142 for a writing test, and there are provided a writing test circuit for generating a writing test signal WTEST, a write voltage-detecting circuit 18 for generating a voltage-detecting signal WREN when a writing voltage supplied to the region 142 is less than a reference value at the time of writing test, and an output buffer circuit 15 which switches it to a test output mode in response to the supply of the writing test signal WTEST and outputs a write inhibit information in response to the supply of voltage-detecting signal WREN.

7 Claims, 2 Drawing Sheets

SEMICONDUCTOR ELECTRICALLY ERASABLE AND WRITEABLE NON-VOLATILE MEMORY DEVICE

BACKGROUND OF THE INVENTION

1. Field of the Invention

This invention relates to a semiconductor memory device, and in particular to an electrically erasable and writable non-volatile semiconductor memory device such as a flash memory or an EEPROM.

2. Description of Related Art

Since in the flash memory, memory data can be changed by means of an external panel or a remotely controlled operation while it is incorporated in a system, and also the capacity thereof can be easily enlarged, it has been increasingly utilized in various fields.

A data writing operation of flash memory will be explained with reference to FIG. 2 where the constitution of a memory cell of ordinary flash memory and a writing method thereof are shown. As shown in FIG. 2, a memory cell M of flash memory is constituted of a single MOS transistor comprising a control gate GC and a floating gate GF. When a data is written into the memory cell M, a voltage is impressed on each of the control gate GC and a drain D to generate a channel current, which current in turn causes the generation of hot carriers due to a collision ionization. When electrons from the hot carriers enter the floating gate GF and are trapped by the oxide film of the floating gate GF, the writing of data is effected. The threshold voltage of the memory cell after the writing of data will become higher than that of the memory cell in which data has not been written due to negative charges accumulated in the oxide film of the floating gate GF.

Referring to FIG. 1 where a conventional semiconductor memory device is indicated by blocks, the conventional semiconductor memory device comprises a data writing unit 100 for writing data into a flash memory cell, a CPU 2, and a supply voltage-detecting circuit 3 which outputs a voltage drop signal POC when a supply voltage VDD falls below a reference voltage. The data writing unit 100 includes an X-decoder 11 for decoding an X address of a memory cell supplied from the CPU 2, a Y-decoder 12 for decoding a Y address of a memory cell supplied from the CPU 2, a memory cell array 114 in which flash memory cells are arranged in rows and columns, a read/write circuit 116 for effecting reading/writing of data of the memory cell array 114 in response to a Y-decode signal, and a system power source 117 for supplying a voltage for the writing.

Next, the operation of the conventional semiconductor memory device will be explained with reference to FIG. 1.

The CPU 2 feeds a write signal WRT to the Y-decoder 12 and the read/write circuit 116. And the CPU 2 feeds an address signal ADDRESS to the X-decoder 11 and the Y-decoder 12. The Y-decoder 12 feeds a Y-decode signal to the read/write circuit 116, where a bit line of the memory cell array 114 corresponding to the Y-decode signal is selected. The system power source 117 applies a writing voltage VPW to the bit line thus selected via the read/write circuit 116. Meanwhile, the system power source 117 applies a high voltage VPP via the X-decoder 11 to a word line of the memory cell array 114 which has been selected by an X-decode signal supplied from the X-decoder 11. As a result, different high voltages VPP and VPW are applied to a gate GC and drain D, respectively, of a memory cell selected in the memory cell array 114 (hereinafter referred to as a selected memory cell) thereby performing the writing of data by a hot carrier effect as mentioned above.

Since the writing of data is performed by utilizing a physical phenomenon of a MOS transistor as explained above, any drop of voltage impressed on each terminal of a selected memory cell in the memory cell array 114 gives a bad influence directly to the writing of data. As a countermeasure for this problem, a supply voltage-detecting circuit 3 for detecting a drop of supply voltage is separately provided. The circuit 3 sends a voltage drop-detecting signal POC "1" to the CPU 2 when supply voltage VDD falls below a reference value. The CPU 2 in turn prevents any access to the memory cell array 114 in response to the signal POC "1". However, since the supply voltage-detecting circuit 3 is located remote from the memory cell array 114, the supply voltage-detecting circuit 3 does not output a voltage drop-detecting signal POC in the case where an that impressing voltage, such as VPW and VPP falls below a reference value, when data is written. The voltage drop-detecting signal POC is not output due to possible wiring current and parasitic resistance of wiring, or due to inner resistance within a power source, relating to the memory cell array 114. As a result, the CPU 2 fails to forbid the writing in the memory cell array 114, so that writing is performed. Generally, an allowance in the range of voltage drop of impressing voltage for the writing of flash memory is very narrow, i.e., the allowance in the range of voltage drop according to the specification of actual products is specified as being −0.3V; therefore, if the range of voltage drop of the impressing voltage at the writing exceeds the allowance, writing errors of data will occur.

Since the writing of data in the aforementioned conventional semiconductor memory device is performed by utilizing a hot carrier effect of a MOS transistor, the device is provided with a supply voltage-detecting circuit for detecting any drop in supply voltage that may cause inferior writing. However, since the supply voltage-detecting circuit is located remote from the memory cell array of the device, voltage drop at (i.e., during) the writing of data due to parasitic resistance of wiring or the like cannot be detected. Therefore, there have been such drawbacks that a defective writing or destruction of data due to voltage drop occurs.

SUMMARY OF THE INVENTION

Accordingly, an object of the present invention is to provide a semiconductor memory device having such a constitution as to enable a judgment of whether or not the writing voltage is sufficient before performing the writing of data, thereby obviating the destruction of data due to insufficient writing voltage.

It has been found possible to achieve the above object by providing a semiconductor memory device having the following constitution.

According to the present invention, there is provided a semiconductor memory device which comprises:

a memory cell array of double structure comprising a control gate and a floating gate, wherein electrically erasable and writable non-volatile memory cells are arranged in rows and columns, said memory cell array including a test memory region composed of test memory cells for writing test;

an X-decoder for decoding an X address of said memory cell array which is supplied from a CPU so as to output an X-decode signal;

a Y-decoder for decoding a Y address of said memory cell array which is supplied from the CPU so as to output a Y-decode signal;

a read/write circuit for effecting the reading/writing of data of said memory cell array by selecting a bit line of said memory cell array in response to said Y-decode signal;

a system power source for supplying said memory cell array with a voltage for writing;

a writing test signal-generating circuit for generating a write signal for a writing test;

a writing voltage-detecting circuit for generating a voltage detection signal when said writing voltage supplied to said test memory cell at a writing test is less than a predetermined reference value; and an output buffer circuit which switches, in response to the supply of the write test signal, a result of the writing test to a test output mode to output it to said CPU and which outputs a write inhibit information, in response to the supply of said voltage-detecting signal, as a result of said test.

And in the semiconductor memory device, said test memory region may include n memory cells, wherein n is an integer greater than 1, each corresponding to each of said n bit lines, and said output buffer circuit includes a logic circuit which sets all of the bit lines corresponding to all of the bits, from a first bit to an (n-1)th bit, to a first logic value in response to the supply of said writing test signal, and generates the write inhibit information corresponding to either one of a first logic value or a second logic value of said voltage-detecting signal.

The above and other objects, features and advantages of the present invention will become apparent from the following description referring to the accompanying drawings which illustrate an example of a preferred embodiment of the present invention.

DESCRIPTION OF THE PREFERRED EMBODIMENT

Figure 1:
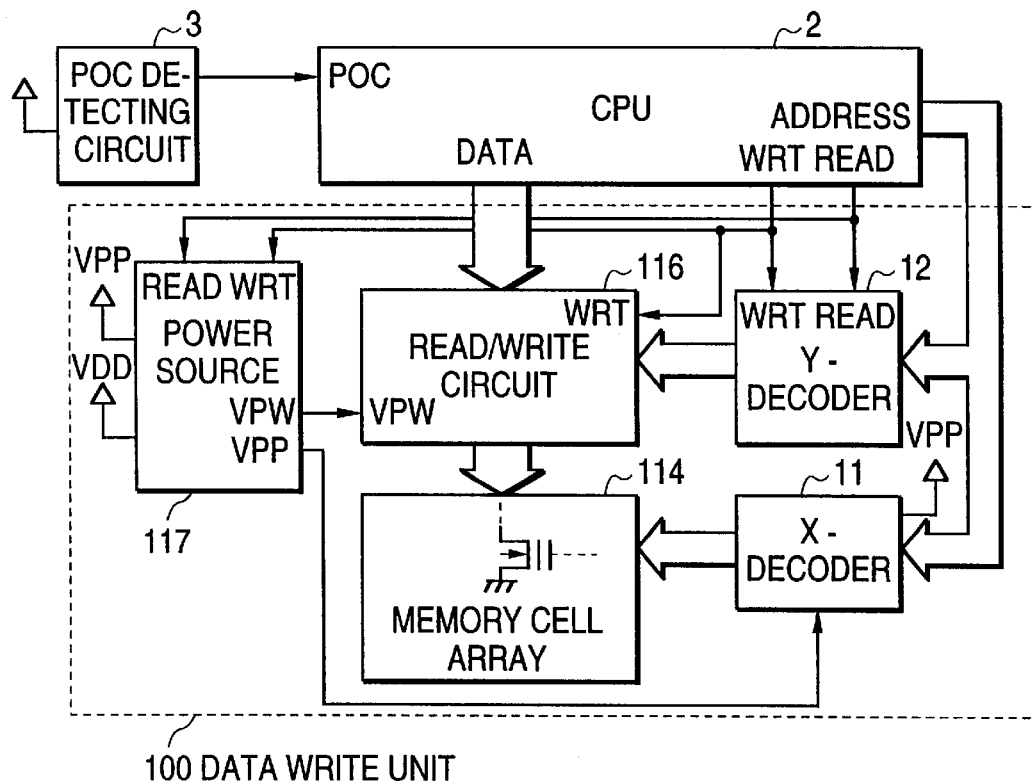
FIG. 1 is a block diagram showing one example of the conventional semiconductor memory device.
Figure 2:
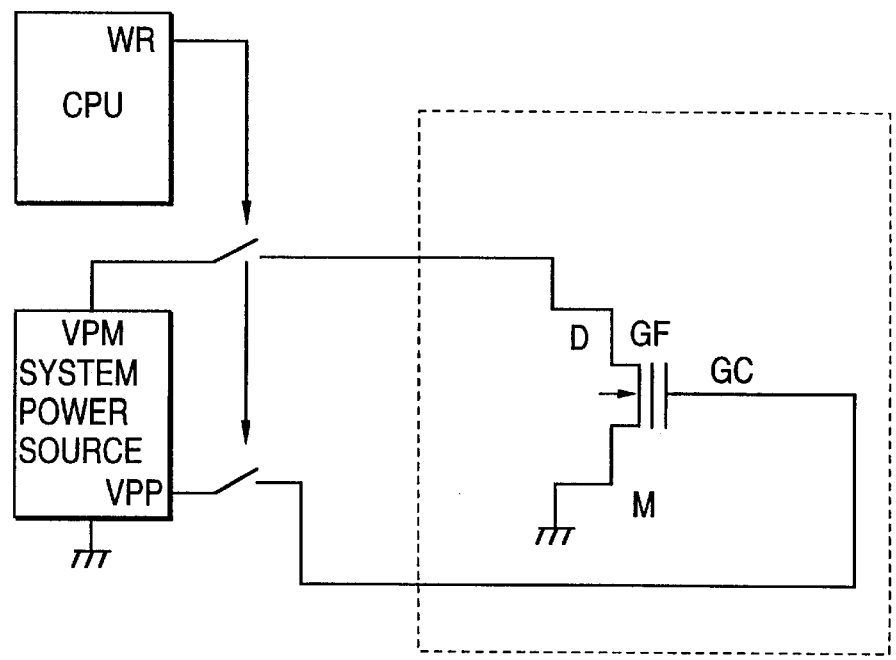
FIG. 2 is a diagram illustrating the constitution of a memory cell of flash memory and a method of writing.
Figure 3:
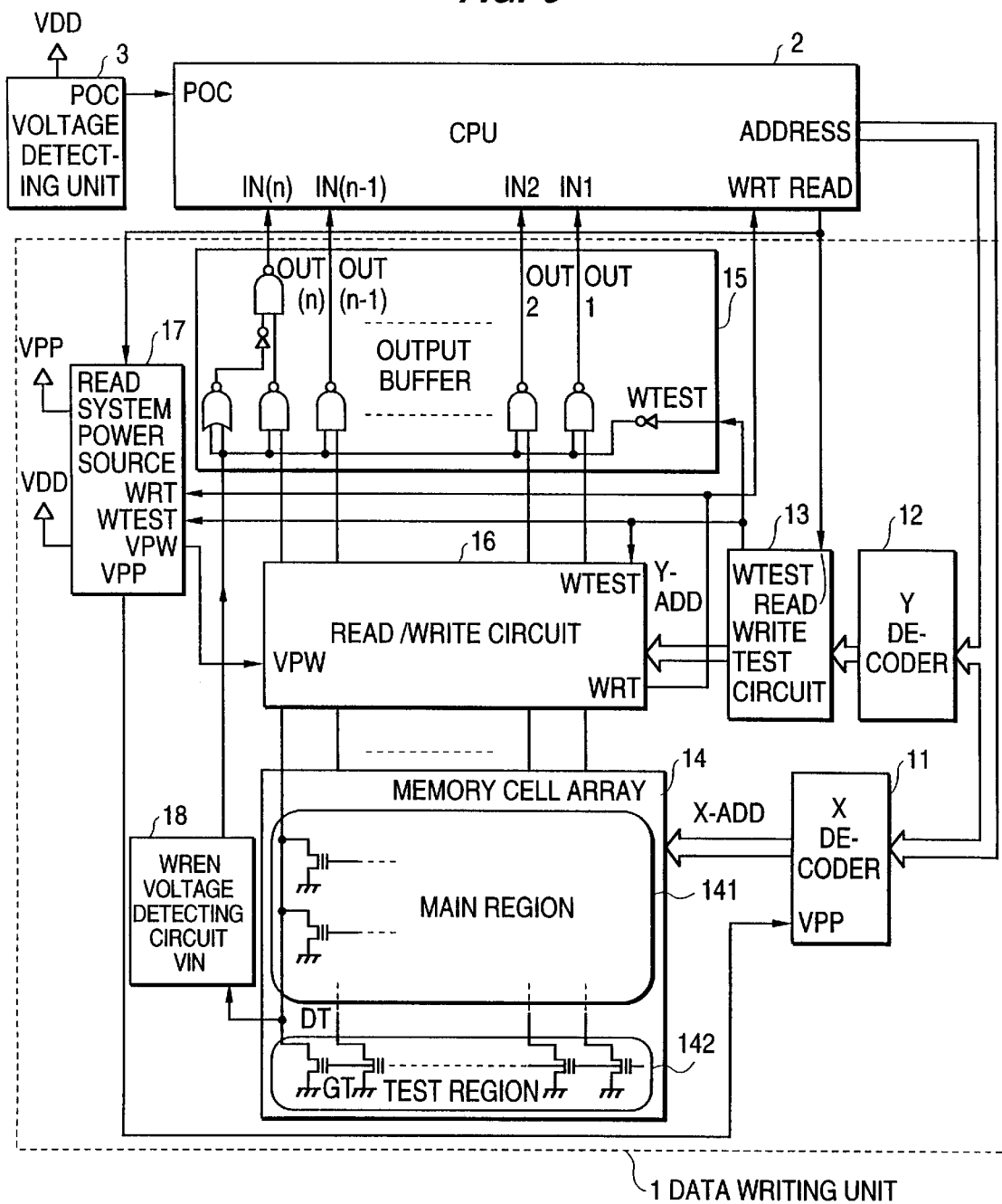
FIG. 3 is a block diagram showing one embodiment of a semiconductor memory device according to the present invention.

This invention will be explained further with reference to an embodiment of a semiconductor memory device shown in FIG. 3, wherein like constituent elements of FIG. 3 and FIG. 1 are given like character blocks in FIG. 3 and FIG. 1. A data writing unit 1 of a semiconductor memory device according to this embodiment is composed of an X-decoder 11 and Y-decoder 12, a writing (i.e., write) test signal-generating circuit 13 for generating a writing test signal, a flash memory cell array 14 comprising a main region 141, a memory cell (i.e., test) region 142 for writing test, an output buffer 15, a read/write circuit 16, a system power source 17, and a write voltage-detecting circuit 18 for detecting writing voltage drop.

Next, an operation of semiconductor memory device according to the embodiment will be explained with reference to FIG. 3. First, before writing data in to memory cells of the main region 141 of the memory cell array 14, the write voltage-detecting circuit 18 tests to determine if the value of writing voltage VPW supplied from the system power source 17 is normal or not normal. If, as a result of the test, the writing voltage VPW is normal, writing is performed in a CPU 2. If VPW is low, the VPW is detected so as to output a writing voltage-drop detection signal to the CPU, thereby to suspend the writing.

The CPU 2 functions to output a read signal READ and an address signal allotted to a writing test memory cell. The address signal is fed to the X-decoder 11 and the Y-decoder 12. The Y-decoder 12 functions to supply a Y-decode signal to the writing test signal-generating circuit 13. The circuit 13 functions to carry out a logical product operation using a READ signal from the CPU 2 and the output signal from the Y-decoder 12, and outputs a writing test signal WTEST "1" (a first logic value) if the logical product is positive, thereby to feed it to each of the read/write circuit 16, output buffer 15, and system power source 17. In response to the signal WTEST, the output buffer 15 is electrically separated from the read/write circuit 16 and switched to a test output mode in which a signal corresponding to the output of the voltage detecting circuit 18 is output to the CPU, and the output voltage of the system power source 17 is switched from the read voltage VPM to the writing voltage VPW. The writing voltage VPW is impressed on a drain DT of a memory cell for testing of the memory cell region 142, which is selected via the read/write circuit 16. On the other hand, a high voltage VPP is impressed on a gate GT of the memory cell for test, which is selected by an X-decode signal from the X-decoder 11. The voltage impressed on the drain DT of the selected memory cell for test is supplied also to the write voltage-detecting circuit 18.

In this case, if the voltage impressed on the drain DT is equal to or higher than a reference voltage which has been set in the write voltage-detecting circuit 18, the circuit 18 outputs a write enable signal WREN "1" to the output buffer 15. In a writing test, a write test signal WTEST becomes "1", and hence each bit of each of the output terminals 1 to (n-1) of the buffer 15 is set to an output of "1". In a writable state, the output of the terminal n also becomes "1", and hence the output buffer 15 sends back outputs (i.e., a write information) to the CPU 2, in which levels of all the bits are set to "1". The CPU 2 switches the read signal READ from "1" to "0" (a second logic value) and outputs a write signal WRT "1", thereby executing the writing.

If the voltage at the drain DT becomes lower than the aforementioned set voltage, a write enable signal WREN "0" is output from the write voltage-detecting circuit 18 to the output buffer 15. In this case, the output of each of the terminals 1 to (n-1) of the buffer 15 becomes "1", and only the output of the terminal n becomes "0". Hence, the output buffer 15 sends back these outputs (i.e., a write information) to the CPU 2. As a result, write voltage drop at the writing of data is detected by the CPU 2 and a read signal READ "1" is maintained by the CPU 2, so that the writing operation is not performed.

As seen from the above operation, in the circuit of the embodiment, the CPU 2 functions to suspend the writing not only when the drain voltage of the memory cell becomes lower than a reference value due to the drop of supply voltage, but also when the drain voltage of the memory cell becomes lower than the reference value due to a voltage drop caused by wiring current and wiring resistance. Therefore, it is possible to prevent the destruction of data due to an inferior writing of data.

As explained above, since the semiconductor memory device according to the present invention comprises a memory dell array provided with a test memory region for a writing test, a writing test signal-generating circuit, a write voltage-detecting circuit and an output buffer circuit for outputting a write inhibit information in response to a supply of a voltage-detecting signal as a result of a test, it is possible to judge the suitability of the writing voltage before the writing of data is performed so as to prevent the destruction of data resulting from an unsuitable writing voltage.

Although the preferred embodiments of the present invention have been described in detail, it should be understood that various changes, substitutions and alternative formations can be made therein without departing from spirit and scope of the invention as defined by the appended claims.

What is claimed is:

1. A semiconductor memory device comprising:

a memory cell array of double structure comprising a control gate and a floating gate, wherein electrically erasable and writable non-volatile memory cells are arranged in rows and columns, said memory cell array including a test memory region composed of test memory cells for a writing test;

an X-decoder for decoding an X address of said memory cell array wherein said X address is supplied from a CPU so as to output an X-decode signal;

a Y-decoder for decoding a Y address of said memory cell array wherein said Y address is supplied from said CPU so as to output a Y-decode signal;

a read/write circuit for effecting the reading/writing of data of said memory cell array by selecting a bit line of said memory cell array in response to said Y-decode signal;

a system power source for supplying said memory cell array, via said read/write circuit, with a writing voltage, said writing voltage supplied to said test memory region during said writing test;

a writing test signal-generating circuit for generating a write test signal for said writing test, wherein said write test signal is supplied to said read/write circuit, to said system power source, and to an output buffer circuit;

said read/write circuit selecting a bit line of said test memory region for writing into said test memory region in response to said test signal;

said system power source supplying said writing voltage to said test memory region in response to said write test signal;

a writing voltage detection circuit responsive to said writing voltage for generating a voltage detection signal in a first state when said writing voltage is less than a predetermined reference value and for generating said voltage detection signal in a second state when said writing voltage is greater that said predetermined reference; and said output buffer circuit responsive to said write test signal for operating in a test output mode, and responsive to said voltage detection signal for generating a write inhibit signal to said CPU to prevent writing into said memory cell array when said voltage detection signal is in said first state.

2. The semiconductor memory device according to claim 1, wherein said test memory region comprises n memory cells each corresponding to each of n bit lines;

said output buffer circuit comprises a logic circuit that sets all of the bit lines, that correspond to each of a first bit to an (n-1)th bit, to a first logic value in response to the supply of said write test signal; and said logic circuit sets the (n)th bit line, corresponding to an (n)th bit, so as to generate said write inhibit signal when said voltage detection signal is in said first state and to generate a write enable signal when said voltage detection signal is in said second state.

3. A method for performing a writing test of a semiconductor memory device having a memory cell array including a test memory region composed of test memory cells for said writing test, said method comprising the steps of:

supplying said memory cell array with a writing voltage, said writing voltage supplied to said test memory region during said writing test;

generating a voltage detection signal in a first state when said writing voltage is less than a predetermined reference value;

generating said voltage detection signal in a second state when said writing voltage is greater that said predetermined reference; and generating a write inhibit signal to prevent writing into said memory cell array when said voltage detection signal is in said first state.

4. A method for performing a writing test as recited in claim 3, further comprising:

generating a write test signal for said writing test, wherein said write test signal is supplied to a read/write circuit, and to a system power source;

selecting a bit line of said test memory region for writing into said test memory region in response to said test signal;

supplying said writing voltage to said test memory region in response to said write test signal;

supplying said write test signal to an output buffer circuit; and generating said write inhibit signal by said output buffer circuit in response to said voltage detection signal.

5. A method for performing a writing test as recited in claim 3 wherein said test memory region comprises n memory cells each corresponding to each of n bit lines further comprising the modified steps of:

generating a write enable signal when said voltage detection signal is in said second state to enable writing into said memory cell array.

6. An apparatus for performing a writing test of a semiconductor memory device comprising:

a memory cell array including a test memory region composed of test memory cells for a writing test, an x-decoder decoding an X address of said memory cell array so as to output an X-decode signal wherein said X address is supplied from a CPU;

a y-decoder decoding a Y address of said memory cell array so as to output a Y-decode signal wherein said Y address is supplied from said CPU;

a read/write circuit selecting a bit line of said memory cell array in response to said Y-decode signal so as to effect the reading/writing of data of said memory cell array;

a power source supplying a writing voltage to said memory cell array, via said read/write circuit, said writing voltage supplied to said test memory region during said writing test;

a means for generating a write test signal for said writing test, wherein said write test signal is supplied to said read/write circuit, and to said power source;

said read/write circuit selecting a bit line of said test memory region for writing into said test memory region in response to said test signal;

said power source supplying said writing voltage to said test memory region in response to said write test signal;

a voltage detection circuit generating a voltage detection signal in a first state when said writing voltage is less than a predetermined reference value and generating said voltage detection signal in a second state when said writing voltage is greater that said predetermined reference; and an output circuit, responsive to said voltage detection signal for generating a write inhibit signal to said CPU to prevent writing into said memory cell array when said voltage detection signal is in said first state.

7. An apparatus for performing a writing test as recited in claim 6 wherein said test memory region comprises n memory cells each corresponding to each of n bit lines further comprising:

a means for setting all of the bit lines, that correspond to each of a first bit to an (n-1)th bit, to a first logic value in response to the supply of said write test signal; and a means for generating a write inhibit signal when said voltage detection signal is in said first state and a means for generating a write enable signal when said voltage detection signal is in said second state.

\* \* \* \* \*